United States Patent
Lee

(10) Patent No.: US 7,282,754 B2
(45) Date of Patent: Oct. 16, 2007

(54) UNIT PIXEL IN CMOS IMAGE SENSOR

(75) Inventor: Won-Ho Lee, Ichon-shi (KR)

(73) Assignee: Magnachip Semiconductor, Ltd. (KR)

( * ) Notice: Subject to any disclaimer, the term of this patent is extended or adjusted under 35 U.S.C. 154(b) by 0 days.

(21) Appl. No.: 10/745,896

(22) Filed: Dec. 23, 2003

(65) Prior Publication Data
US 2004/0217396 A1    Nov. 4, 2004

(30) Foreign Application Priority Data
Apr. 30, 2003   (KR) .................. 10-2003-0027770

(51) Int. Cl.
*H01L 31/062* (2006.01)
(52) U.S. Cl. .................. 257/292; 257/444; 257/448
(58) Field of Classification Search ................ 257/292, 257/291, 446, 448
See application file for complete search history.

(56) References Cited

U.S. PATENT DOCUMENTS 6,853,044 B1 *  2/2005  Chung et al. ............... 257/444

FOREIGN PATENT DOCUMENTS

JP          2002-329855       *  11/2002

* cited by examiner

*Primary Examiner*—Sara Crane
(74) *Attorney, Agent, or Firm*—Blakely Sokoloff Taylor & Zafman

(57) ABSTRACT

A unit pixel for use in a CMOS image sensor is employed to minimize a contact resistance between adjacent unit pixels by employing a supplementary p-well or modifying a unit pixel layout. The unit pixel having a photodiode, a transfer transistor, a reset transistor, a drive transistor and a selection transistor, the unit pixel including: a first active area having a protrusive portion thereof where the transfer transistor, the reset transistor and a VDD contact are formed, in which the VDD contact is formed apart from the photodiode in an adjacent unit pixel by a predetermined distance, to thereby minimize a leakage current, the first active area being connected to the photodiode; and a second active area where the drive transistor, the selection transistor and an output contact are formed, wherein the second active area is perpendicularly connected to the first active area.

11 Claims, 5 Drawing Sheets

UNIT PIXEL IN CMOS IMAGE SENSOR

FIELD OF THE INVENTION

The present invention relates to a semiconductor device; and, more particularly, to a unit pixel in a complementary metal oxide semiconductor (CMOS) image sensor for preventing a contact leakage between adjacent unit pixels.

DESCRIPTION OF THE PRIOR ART

Generally, a unit pixel in a complementary metal oxide semiconductor (CMOS) image sensor includes one photodiode and four nMOSFETs. The four transistors include a transfer transistor for transferring photo-electric charges generated from the photodiode to a floating diffusion region, a reset transistor for discharging the charges stored in the floating sensing node to detect subsequent signals, a drive transistor serving as a source follower, and a selection transistor acting as a switching to an addressing.

Referring to FIG. 1, there is provided a plane view setting forth a unit pixel in the conventional CMOS image sensor.

In FIG. 1, one side of a gate electrode 12 of the transfer transistor (hereinafter referred to as a transfer gate) is overlapped a predetermined portion of an active area where the photodiode 11 will be formed. At the other side of the transfer gate 12, there is formed the floating diffusion region 13. From the photodiode 11 to the floating diffusion region 13, an interface area is reduced like a bottle necks wherein the photodiode 11 has relatively a large area in comparison with the others.

In a counterclockwise direction from the photodiode 11, there are formed a gate electrode 14 of the reset transistor, a gate electrode 15 of the drive transistor and a gate electrode 16 of the selection transistor in series, wherein the gate electrode 16 of the reset transistor, the gate electrode 15 of the drive transistor and the gate electrode 16 of the selection transistor are referred to as a reset gate 14, a drive gate 15 and a select gate 16 respectively, for the sake of convenience. Herein, each gate 12, 14, 15, 16 is separated by each predetermined distance. A power supply voltage (VDD) contact 17 is electrically connected to an active area disposed between the reset gate 14 and the drive gate 15. An output contact is electrically connected to an active area disposed aside the select gate 18.

Referring to FIG. 2, there is shown a cross section view of the unit pixel in the conventional CMOS image sensor taken along line A-A' of FIG. 1.

In FIG. 2, a p-type epitaxial layer 22 of a low concentration is grown up on a p-type substrate 20 doped with a high concentration p-type impurity. A field oxide (FOX) area 24 is formed in a predetermined location of the p-type epitaxial layer 22, thereby defining the active area. In another predetermined location of the p-type epitaxial layer 22, there is formed a p-well 19 where a drive transistor and a selection transistor will be formed by dopant-diffusion during a post thermal process. A transfer transistor and a reset transistor are formed in the other predetermined location of the p-type epitaxial layer 22 without the p-well 19, wherein the transfer transistor and the reset transistor are separated by a predetermined distance from each other. Herein, each transistor has spacers 29 on sidewalls of each gate electrode 12, 14, 15, 16. Furthermore, there is typically formed a gate insulator (not shown) beneath the gate electrode.

The photodiode 11 has a PN junction of a deep n-type diffusion layer 27 and a shallow p-type diffusion layer 28, wherein the shallow p-type diffusion layer 28 is formed after a formation of the deep n-type diffusion layer 27 by using a method such as an ion-implantation technique or a impurity diffusion technique. A floating diffusion region 13 is formed in the p-type epitaxial layer 22 disposed between the transfer gate 12 and the reset gate 14.

Meanwhile, the drive transistor and the selection transistor have each $n^+$ diffusion region 21 with n-type lightly doped drains (LDDS) 23 in the p-well 19, while the reset transistor and transfer transistor have each $n^+$ diffusion region 25, 26 without LDDs. One of the n+ diffusion regions 21 of the selection transistor plays a role as an output. In addition, the $n^+$ diffusion region 25 disposed between the reset gate 14 and the drive gate 15 is electrically connected to a VDD contact 17.

As described above, since there is no p-well below the $n^+$ diffusion region 25 which is connected to the VDD contact 17, a VDD contact junction is a PN junction of the p-type epitaxial layer 22 and the $n^+$ diffusion region 25. According to the prior art, the VDD contact junction has the PN junction so that a depletion region beneath the $n^+$ diffusion region 25 is broadened when a high voltage is applied thereto. Therefore, a plurality of electrons rush into an adjacent unit pixel, thereby inducing a contact leakage. Therefore, it is difficult to prevent the electrons rushing into the photodiode in the adjacent unit pixel.

Referring to FIG. 3, there is shown a schematic plane view setting forth the contact leakage conducted from one unit pixel to the other unit pixel.

In FIG. 3, when a high voltage is applied to the VDD contact 17, the electrons are overflowed and jump into the photodiode 11 in the adjacent unit pixel, thereby generating the contact leakage. That is, since the VDD contact junction has no p-well therein, it is impossible to prevent the electrons jumping into the adjacent unit pixel. This leakage phenomenon is more serious problem as the semiconductor device is more highly integrated because a cell space is more and more reduced as a decrease of a design rule. Moreover, the contact leakage between the adjacent unit pixels may incur a dark bad pixel in the long run.

SUMMARY OF THE INVENTION

It is, therefore, an object of the present invention to provide a unit pixel in a complementary metal oxide semiconductor (CMOS) image sensor for minimizing a contact resistance between adjacent unit pixels by employing a supplementary p-well or modifying a unit pixel layout.

In accordance with one aspect of the present invention, there is provided a unit pixel for use in a complementary metal oxide semiconductor (CMOS) image sensor having a photodiode, a transfer transistor, a reset transistor, a drive transistor and a selection transistor, the unit pixel including: a first well where the drive transistor and the selection transistor are formed; and a second well where a diffusion region electrically connected to a power supply voltage (VDD) contact is formed between the drive transistor and the reset transistor.

In accordance with another aspect of the present invention, there is provided a unit pixel for use in a CMOS image sensor having a photodiode, a transfer transistor, a reset transistor, a drive transistor and a selection transistor, the unit pixel including: a first active area having a protrusive portion thereof where the transfer transistor, the reset transistor and a VDD contact are formed, in which the VDD contact is formed apart from the photodiode in an adjacent unit pixel by a predetermined distance, to thereby minimize a leakage current, the first active area being connected to the photodiode; and a second active area where the drive transistor, the selection transistor and an output contact are formed, wherein the second active area is perpendicularly connected to the first active area.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
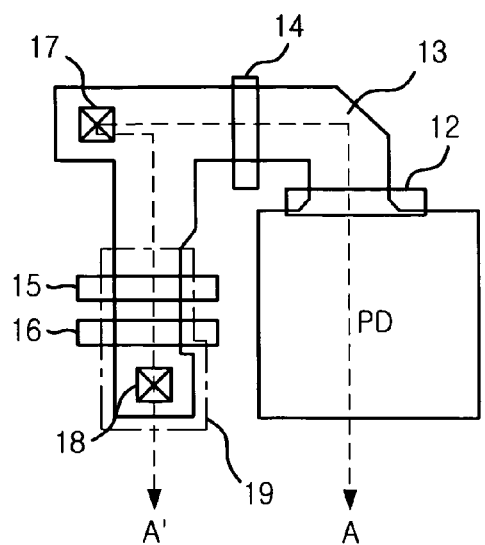
FIG. 1 is a plane view setting forth a unit pixel in a conventional complementary metal oxide semiconductor (CMOS) image sensor.
Figure 2:
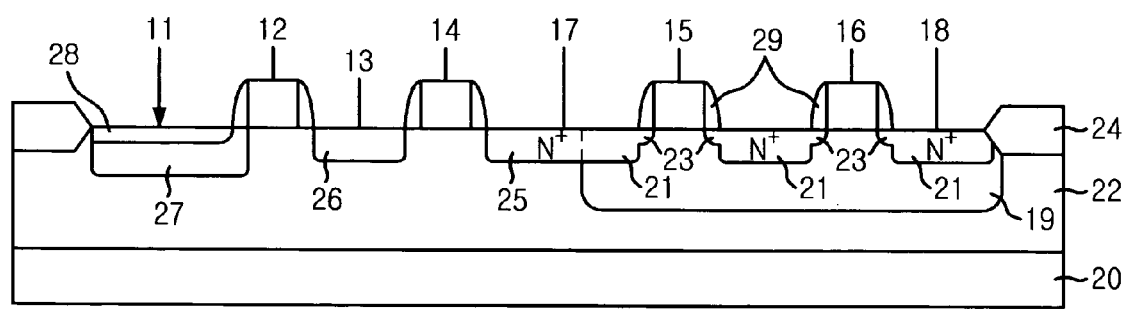
FIG. 2 is a cross sectional view setting forth the unit pixel in the conventional CMOS image sensor taken along line A-A' of FIG. 1.
Figure 3:
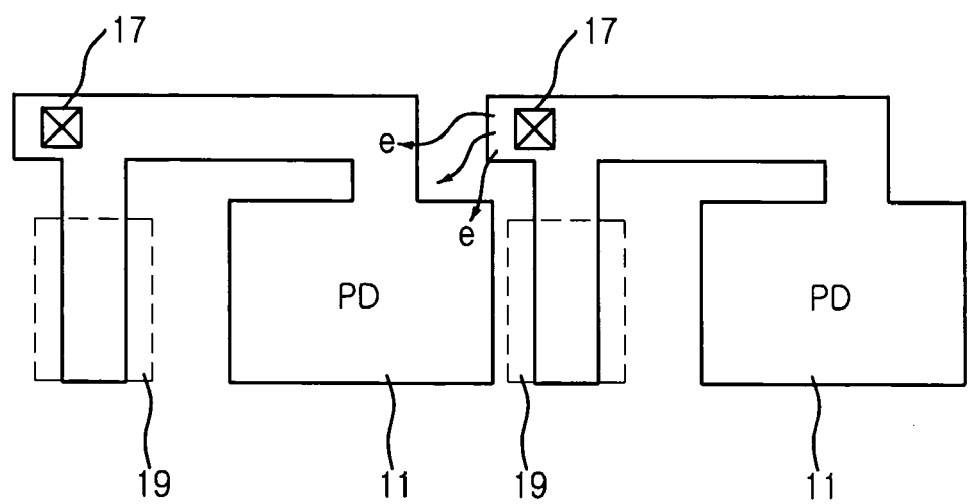
FIG. 3 is a plane view setting forth a contact leakage generated from one unit pixel to another in the conventional CMOS image sensor.

There are provided in FIGS. 4 to 8 plane views of unit pixels in a complementary metal oxide semiconductor (CMOS) image sensor for preventing a contact leakage between adjacent unit pixels in accordance with preferred embodiments of the present invention. It should be noted that like parts appearing in FIGS. 4 to 9 are represented by like reference numerals.

Figure 4:
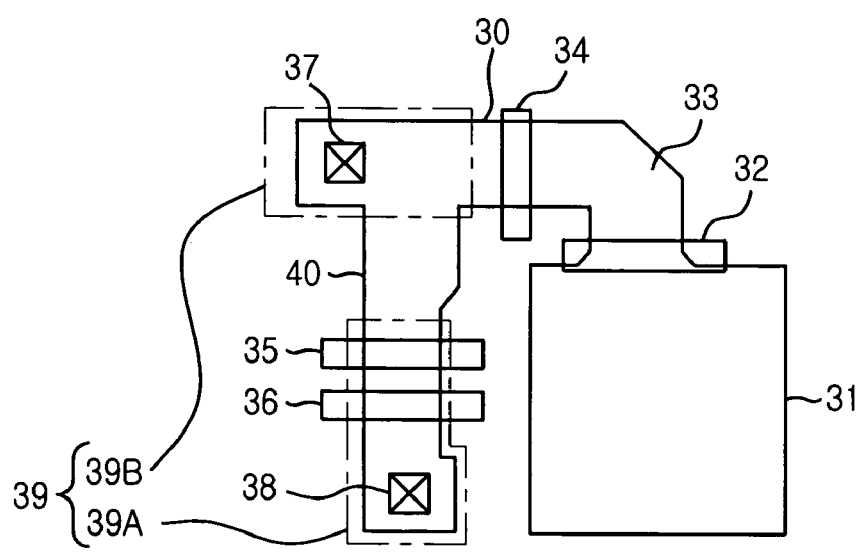
FIG. 4 is a plane view setting forth a unit pixel in a CMOS image sensor in accordance with a first preferred embodiment of the present invention.
Figure 5:
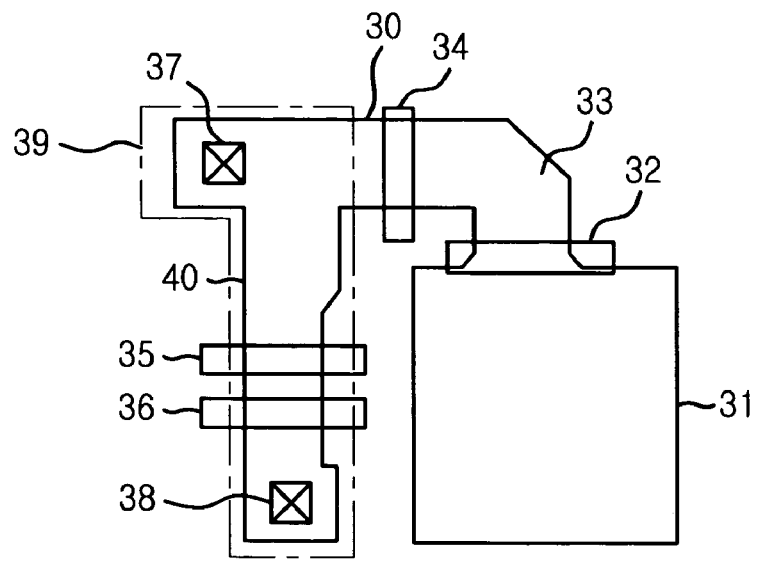
FIG. 5 is a plane view setting forth a unit pixel in a CMOS image sensor in accordance with a second preferred embodiment of the present invention.

Referring to FIGS. 4 and 5, there are shown plane views of unit pixels in the CMOS image sensor in accordance with a first and a second preferred embodiments of the present invention, for preventing a contact leakage between adjacent unit pixels by employing a supplementary p-well containing a diffusion region electrically connected to a power supply voltage (VDD) contact.

FIG. 4 shows a plane view of a unit pixel in the CMOS image sensor in accordance with a first preferred embodiment of the present invention.

In FIG. 4, there is an active area including a first active area 30 where a transfer gate 32, a reset gate 34 and a VDD contact 37 will be formed and a second active area 40 which is perpendicularly in contact with the first active area 30, wherein the first active area 30 has a protrusive portion. In the second active area 40, a drive gate 35, a select gate 36 and an output contact 38 is formed in predetermined locations.

In detail, the transfer gate 32 is overlapped a predetermined portion of another active area where the photodiode 31 will be formed. At the other side of the transfer gate 32, there is formed a floating diffusion region 33 in the first active area 30. From the photodiode 31 to the floating diffusion region 33, a pathway area is reduced like a bottle neck, wherein the photodiode 31 has relatively a large area in comparison with the other regions. In a counterclockwise direction from the photodiode 31, there are formed the reset gate 34, the drive gate 35 and the select gate 36 in series, wherein each gate is separated by each predetermined distance. A VDD contact 37 is electrically connected to a protrusive portion of the first active area 30 in a plane view. Meanwhile, an output contact 38 is electrically connected to the second active area 40 disposed aside the select gate 36.

In the first embodiment, there is a dual p-well 39 having a first p-well 39A and a second p-well 39B in the first and the second active areas 30, 40, wherein the first p-well 39A and the second p-well 39B are separated by a predetermined distance. Herein, the drive gate 35 and the select gate 36 are formed within the first p-well 39A like the prior art. Meanwhile, a predetermined diffusion region where the VDD contact 37 is electrically connected is formed within the second p-well 39B. As depicted in the drawing, the second p-well 39B should completely contain the protrusive portion of the first active area 30 which is disposed left side of the VDD contact 37 in a plane view, for preventing the electrons flowing into an adjacent unit pixel. That is, the first preferred embodiment employs the second p-well 39B additionally where the predetermined diffusion region connected to the VDD contact 37 will be formed, thereby avoiding the contact leakage between the adjacent unit pixels in the CMOS image sensor although the high voltage in applied to the VDD contact 37.

FIG. 5 shows a plane view of the inventive unit pixel in the CMOS image sensor in accordance with a second preferred embodiment of the present invention.

In FIG. 5, a unit pixel layout is same to that of the first embodiment except a channel type p-well 39. That is, in the second embodiment, there is formed the channel type p-well 39 in the a protrusive portion of a first active area 30 and a second active area, wherein the channel type p-well contains a diffusion region where the VDD contact 37 is electrically connected as well as the typical p-well for the drive transistor and the selection transistor. In detail, the channel type p-well 39 is formed by extending the typical p-well to the protrusive portion of the first active area where the diffusion region connected to the VDD contact 37 is formed. Accordingly, in spite of applying a high voltage to the VDD contact 37, it is possible to prevent the contact leakage between the adjacent unit pixels in the CMOS image sensor because the diffusion region connected to the VDD contact 37 is completely embraced by the channel type p-well 39.

Referring to FIGS. 6 to 9, there are plane views of unit pixels in the CMOS image sensor in accordance with a third, a fourth, a fifth and a sixth preferred embodiments of the present invention, for preventing a contact leakage between adjacent unit pixels by modifying a unit pixel layout. In FIGS. 6 to 9, there are described only two unit pixels in the unit pixel array of the CMOS image sensor for the sake of convenience.

Figure 6:
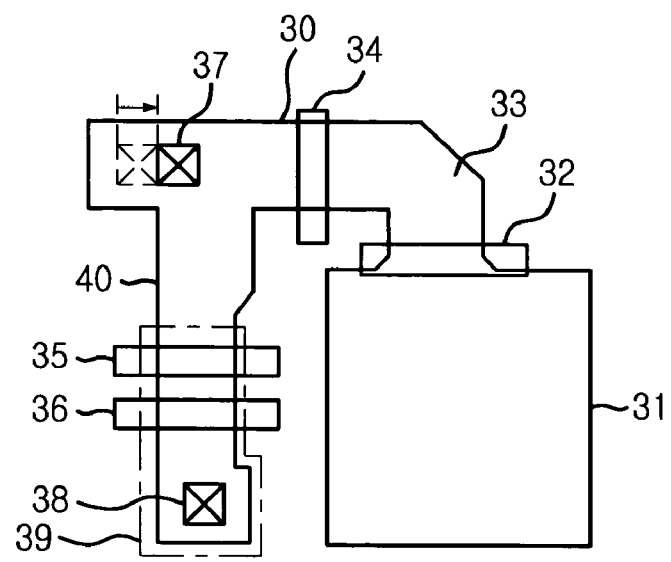
FIG. 6 is a plane view setting forth a unit pixel in a CMOS image sensor in accordance with a third preferred embodiment of the present invention.

FIG. 6 shows a plane view of a unit pixel array in the CMOS image sensor in accordance with a third preferred embodiment of the present invention.

In FIG. 6, a unit pixel layout is same to that of the prior art CMOS image sensor except a position of VDD contacts 37. That is, in the third embodiment, a p-well 39 for the drive transistor 35 and the selection transistor 36 is formed in a second active area 40 like the prior art. However, the VDD contact 37 of the unit pixel is formed apart from a protrusive portion of a first active area 30 in comparison with the prior art. Namely, the VDD contact 37 of the unit pixel is shifted toward the reset transistor 34 by a predetermined distance with respect to the typical position of the VDD contact so that it is possible to form the VDD contact 37 far from the protrusive portion of the first active area 30. Therefore, a distance from the VDD contact 37 to a photodiode in the adjacent unit pixel gets longer than the prior art so that it is possible to avoid a contact leakage between the adjacent unit pixels in the CMOS image sensor without any, supplementary formation of the p-well under the VDD contact 37.

Herein, it is preferable that the distance from the VDD contact 37 to the photodiode in the adjacent unit pixel ranges from about 0.25 μm to about 0.38 μm in order that leakage current flows in a range of about $1.0 \times 10^{-11} A/\mu m^2$ to about $9.9 \times 10^{-11} A/\mu m^2$ when the VDD is applied to the VDD contact 37 in the range of about 2.5 V to about 2.8 V.

Figure 7:
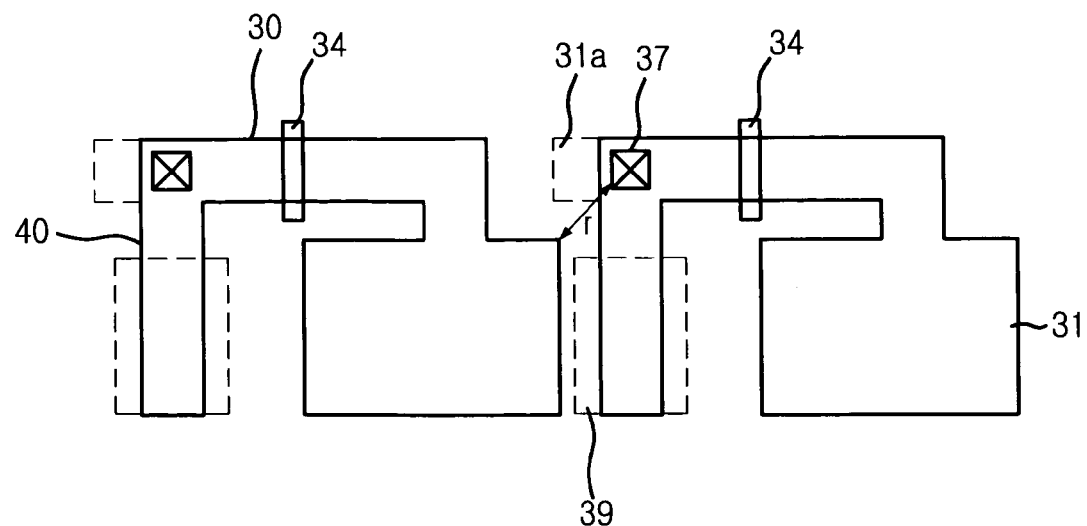
FIG. 7 is a plane view setting forth a unit pixel in a CMOS image sensor in accordance with a fourth preferred embodiment of the present invention.

FIG. 7 shows a plane view of a unit pixel array in the CMOS image sensor in accordance with a fourth preferred embodiment of the present invention.

In FIG. 7, a unit pixel layout is same to that of the third embodiment except a removal of a protrusive portion 31A of a first active area 30 in the unit pixel. That is, the protrusive portion 31A of the first active area 30 in the unit pixel is removed and simultaneously the VDD contact 37 is shifted toward the rest transistor 34, thereby increasing a distance from the VDD contact 37 to the photodiode in the adjacent unit pixel. Herein, it is preferable that the distance from the VDD contact 37 to the photodiode in the adjacent unit pixel ranges from about 0.25 μm to about 0.38 μm in order that leakage current flows in a range of about $1.0 \times 10^{-11} A/\mu m^2$ to about $9.9 \times 10^{-11} A/\mu m^2$ when the VDD is applied to the VDD contact 37 in the range of about 2.5 V to about 2.8 V.

Figure 8:
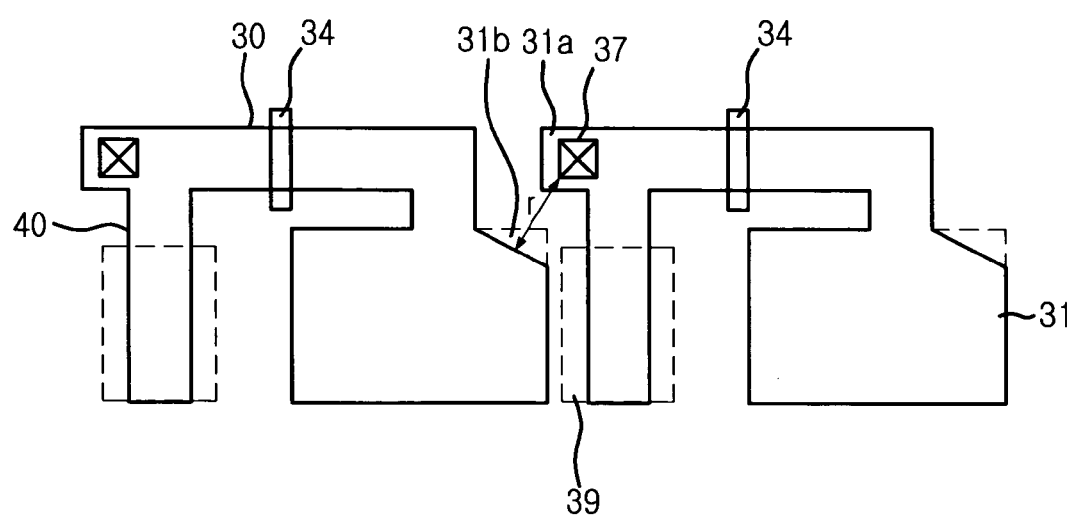
FIG. 8 is a plane view setting forth a unit pixel in a CMOS image sensor in accordance with a fifth preferred embodiment of the present invention.

FIG. 8 shows a plane view of a unit pixel array in the CMOS image sensor in accordance with a fifth preferred embodiment of the present invention.

In FIG. 8, a unit pixel layout is same to that of the prior art CMOS image sensor except a removal of a corner 31B of a photodiode in the unit pixel. That is, the corner of the photodiode is removed in the fifth embodiment, thereby increasing a distance from the VDD contact 37 to the photodiode in the adjacent unit pixel. Herein, it is preferable that the distance from the VDD contact 37 to the photodiode in the adjacent unit pixel ranges from about 0.25 μm to about 0.38 μm in order that leakage current flows in a range of about $1.0 \times 10^{-11} A/\mu m^2$ to about $9.9 \times 10^{-11} A/\mu m^2$ when the VDD is applied to the VDD contact 37 in the range of about 2.5 V to about 2.8 V.

Figure 9:
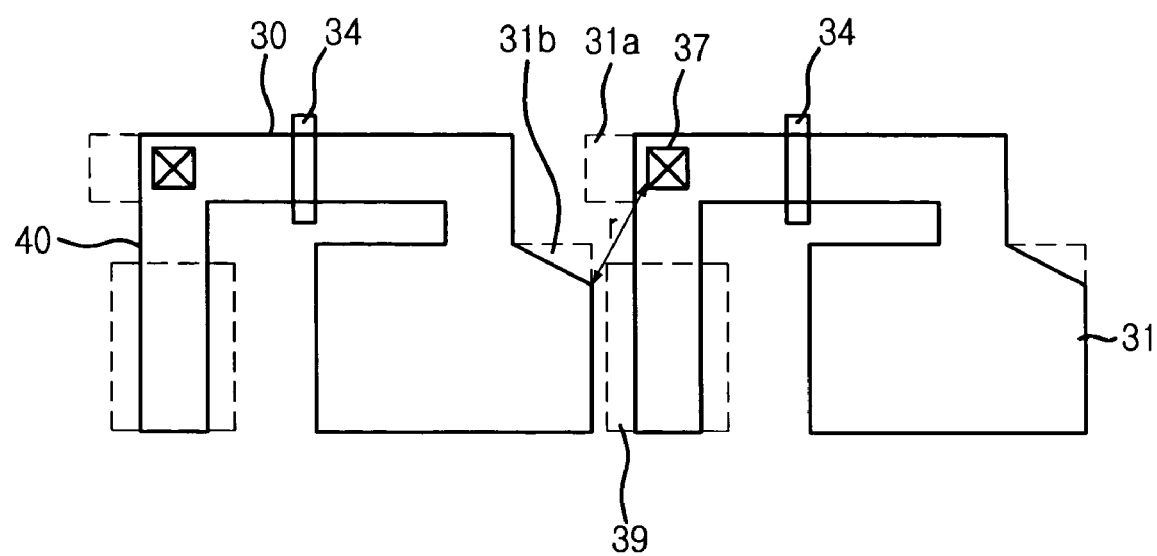
FIG. 9 is a plane view setting forth a unit pixel in a CMOS image sensor in accordance with a sixth preferred embodiment of the present invention.

FIG. 9 shows a plane view of a unit pixel array in the CMOS image sensor in accordance with a sixth preferred embodiment of the present invention.

In FIG. 9, a unit pixel layout is same to that of the prior art CMOS image sensor except a removal of a corner 31B of a photodiode 31 and a protrusive portion 31A of a first active area 30. That is, the corner of the photodiode 31 and the protrusive portion 31A of the first active area 30 are simultaneously removed in the sixth embodiment, thereby increasing a distance from the VDD contact 37 to the photodiode in the adjacent unit pixel. That is, the distance can be more increased than the aforementioned embodiments so that the electrons are hardly flow into the photodiode of the unit pixel, thereby preventing the contact leakage between the adjacent unit pixels. Herein, it is preferable that the distance from the VDD contact 37 to the photodiode in the adjacent unit pixel ranges from about 0.25 μm to about 0.38 μm in order that leakage current flows in a range of about $1.0 \times 10^{-11} A/\mu m^2$ to about $9.9 \times 10^{-11} A/\mu m^2$ when the VDD is applied to the VDD contact 37 in the range of about 2.5 V to about 2.8 V.

Meanwhile, the third, the fourth, the fifth and the sixth embodiments are implemented by lengthening the distance physically from the VDD contact 37 to the photodiode 31 of the adjacent unit pixel through a modification of the unit pixel layout. However, a dual p-type well or a channel type p-well can also be applied to the sixth embodiment simultaneously, for preventing the contact leakage more effectively. Since a detail explanation for the dual p-well and the channel type p-well has been described already in the first and the second embodiments, further description will be abbreviated.

While the present invention has been described with respect to the particular embodiments, it will be apparent to those skilled in the art that various changes and modifications may be made without departing from the scope of the invention as defined in the following claims.

What is claimed is:

1. A unit pixel for use in a complementary metal oxide semiconductor (CMOS) image sensor having a photodiode, a transfer transistor, a reset transistor, a drive transistor and a selection transistor, the unit pixel comprising:
   a first well where the drive transistor and the selection transistor are formed; and
   a second well where a diffusion region electrically connected to a power supply voltage (VDD) contact is formed between the drive transistor and the reset transistor.

2. The unit pixel as recited in claim 1, wherein the first well and the second well are separated by a predetermined distance from each other.

3. The unit pixel as recited in claim 1, wherein the first well is coupled to the second well like a channel type well.

4. The unit pixel as recited in claim 1, wherein the first and the second well are p-type well.

5. A unit pixel for use in a CMOS image sensor having a photodiode, a transfer transistor, a reset transistor, a drive transistor and a selection transistor, the unit pixel comprising:
   a first active area, having a protrusive portion thereof, where the transfer transistor, the reset transistor and a VDD contact are formed, in which the VDD contact is formed out of the protrusive portion, to thereby reduce a leakage current between the VDD contact and an adjacent photodiode by forming the VDD contact apart from the adjacent photodiode by a predetermined distance, the first active area being connected to the photodiode;
   a second active area where the drive transistor, the selection transistor and an output contact are formed, wherein the second active area is perpendicularly connected to the first active area; and
   a supplementary p-well containing a predetermined portion of the first active area which is connected to the VDD contact.

6. The unit pixel as recited in claim 5, wherein the predetermined distance ranges from about 0.25 μm to about 0.38 μm in order that leakage current flows in a range of about $1.0\times10^{-11}A/\mu m^2$ to about $9.9\times10^{-11}A/\mu m^2$ when the VDD is applied to the VDD contact in the range of about 2.5 V to about 2.8 V.

7. A CMOS image sensor having a plurality of unit pixels, each containing a photodiode, a transfer transistor, a reset transistor, a drive transistor and a selection transistor, said each unit pixel comprising:
- a first well where the drive transistor and the selection transistor are formed; and
- a second well where a diffusion region electrically connected to a power supply voltage (VDD) contact is formed between the drive transistor and the reset transistor.

8. The unit pixel as recited in claim 7, wherein the first well and the second well are separated by a predetermined distance from each other.

9. The unit pixel as recited in claim 7, wherein the first well is coupled to the second well like a channel type well.

10. A CMOS image sensor having a plurality of unit pixels, each containing a photodiode, a transfer transistor, a reset transistor, a drive transistor and a selection transistor, said each unit pixel comprising:
- a first active area having a protrusive portion thereof where the transfer transistor, the reset transistor and a VDD contact are formed, in which the VDD contact is formed out of the protrusive portion, to thereby reduce a leakage current between the VDD contact and an adjacent photodiode by forming the VDD contact apart from the adjacent photodiode by a predetermined distance, the first active area being connected to the photodiode;
- a second active area where the drive transistor, the selection transistor and an output contact are formed, wherein the second active area is perpendicularly connected to the first active area; and
- a supplementary p-well containing a predetermined portion of the first active area which is connected to the VDD contact.

11. The CMOS image sensor as recited in claim 10, wherein the predetermined distance ranges from about 0.25 μm to about 0.38 μm in order that leakage current flows in a range of about $1.0\times10^{-11}A/\mu m^2$ to about $9.9\times10^{-11}A/\mu m^2$ when the VDD is applied to the VDD contact in the range of about 2.5 V to about 2.8 V.

* * * * *